United States Patent

Meltzer et al.

[11] Patent Number: 5,953,283
[45] Date of Patent: Sep. 14, 1999

[54] MULTI-PORT SRAM WITH REDUCED ACCESS REQUIREMENTS

[75] Inventors: David Meltzer, Wappingers Falls; Joel Abraham Silberman, Somers, both of N.Y.

[73] Assignee: International Business Machines Corporation, Armonk, N.Y.

[21] Appl. No.: 09/127,332

[22] Filed: Jul. 31, 1998

[51] Int. Cl.$^6$ ............................................. G11C 8/00
[52] U.S. Cl. ............................. 365/230.05; 365/189.02
[58] Field of Search ........................... 365/230.05, 154, 365/189.02, 189.05, 230.02

[56] References Cited

U.S. PATENT DOCUMENTS

| | | | |
|---|---|---|---|
| 5,177,706 | 1/1993 | Shinohara et al. | 365/189.04 |
| 5,255,239 | 10/1993 | Taborn et al. | 365/230.05 |
| 5,568,443 | 10/1996 | Dixon et al. | 365/230.05 |
| 5,793,681 | 8/1998 | Nii | 365/189.05 |
| 5,877,976 | 3/1999 | Lattimore et al. | 365/230.05 |

OTHER PUBLICATIONS

G. Gerosa et al., "A 2.2 W, 80 Mhz superscalar RISC Microprocessor", IEEE Journal of Solid–State Circuits, vol. 29, No. 12, Dec. 1994, pp. 1440–1454.

*Primary Examiner*—Son T. Dinh
*Attorney, Agent, or Firm*—Kevin M. Jordan

[57] ABSTRACT

An improved multi-port SRAM that requires fewer access means, bit lines and sense amplifiers for multiport access. The number of access means can be reduced to ceiling ($\log_2$ B), where B is the number of access ports. The number of bit line sense amplifiers needed to achieve multiport access can also be reduced by the same factor as the number of access devices per cell. An efficient means is provided to select a correct access device among the plurality of access devices within the array and to condition a correct multiplexer select signal to couple a correct bit as specified by the port read address to the port read output. The access device selection can be implemented by a tree representation of all possible bit line and multiplexer select combinations. The tree representation can be implemented in hardware or software. Examples are provided of both a circuit and a tree walking algorithm that gives priority by port order. Alternatively, logic to select the bit lines and controls could give priority in bit order. In either case, examples are provided for modifying the strict priority order to avoid conflicts and obtain a correct solution.

12 Claims, 13 Drawing Sheets

MULTI-PORT SRAM WITH REDUCED ACCESS REQUIREMENTS

FIELD OF THE INVENTION

The present invention relates to an improved multi-port SRAM (static random access memory) array. More particularly the present invention relates to a multi-port SRAM requiring fewer access devices and bit lines for multiport access.

BACKGROUND OF THE INVENTION

A conventional multiported SRAM is described in "A 2.2 W, 180 MHz Superscalar RISC Microprocessor," by Gerosa et al, IEEE Journal of Solid-State Circuits, vol. 29, No. 12, December 1994. Another conventional multiported SRAM array is shown in U.S. Pat. No. 5,177,706, "Semiconductor Memory Device Having a Plurality of Ports, issued Jan. 5, 1993 to Shinohara et al. An example of a geometry of a standard approach is shown in FIG. 1, where a 4 read-port array is composed of a 4×4 array of cells (10, 11, 12, 13, . . . ). As depicted, a representative core cell 10, includes a data latch function 100 connected to 4 access means (110, 111, 112, 113), which are symbolically represented as logical AND functions. Each AND function is gated by one of the word lines (131, 132, 133, 134) to couple a value held in a data latch 100 to one of the four bit lines (121, 122, 123, 124). The activation of one of the word lines results in the coupling of the 4 bits on a port word line to each of the four port bit lines, one of which is selected by asserting an appropriate select signal 140 on one of the 4 multiplexers (150, 151, 152, 153). Sense amplifiers (160–175) are connected to each of the bit lines for detecting and amplifying the stored data. This effectively results in selecting one of 16 bits for each read port depending on the address presented to the bit and word line decoders. It is obvious that this structure can be conventionally replicated to achieve a realistic array size, by connecting N in parallel to achieve a N bit word readout and stacking M vertically to achieve the required capacity. Using a small (e.g., 4×4) sub-array keeps the number of bits per bit-line small and therefore speeds up the read time. The number of bits per row or column can also be adjusted to fit the desired parameters of the array.

A disadvantage to the conventional approach lies in the number of decoders, readout devices and sense amplifiers needed. Each port must have a sense amplifier per bit and a readout means per cell. For a differential readout (i.e., bit and not bit per port), 2 transistors are required per port per bit. In addition, a bit line (121 . . . 124) must exist for each port for each column of the array. In FIG. 1, for example, 16 bit cells require 128 transistors for readout on 4 bit line pairs per column. The core cells of the 16 bit to array only require 64 transistors in the smallest embodiment.

Thus there is a need for an improved multi-port SRAM (static random access memory) array, which requires fewer components—e.g., access transistors, bit lines and sense amplifiers—for multiport access. The SRAM should provide an efficient means to select a correct access device among the plurality of access devices within the array and to condition the correct multiplexer select signal to couple the correct bit as specified by the port read address to the port read output. The present invention addresses these needs.

SUMMARY OF THE INVENTION

Accordingly, it is an object of the present invention to provide an improved multi-port SRAM array. It is a further object of the present invention to reduce the number of access transistors needed for multiport access. A still further object of the present invention is to reduce the number of access means to ceiling($\log_2$ N), where N is the number of access ports. Another object of the present invention to reduce the number of bit lines and bit line sense amplifiers needed to achieve multiport access by the same factor as the number of access devices per cell are reduced. It is a more particular object of the present invention to provide efficient means to select a correct access device among the plurality of access devices within the array and to condition the correct multiplexer select signal to couple the correct bit as specified by the port read address to the port read output.

An example a multi-port static random access memory (SRAM) core cell array in accordance with the present invention comprises: a plurality of core cells arranged in a rectangular N×M×P array of N rows, M columns and P planes, wherein the array includes one core cell per bit; each core cell including:

a data latch for storing binary data, the data latch having an input for writing data into the latch and an output for reading data from the latch;

at least two access devices, each having a first input connected to the data latch and a second input controllable by a gating logic signal, which when active transfers latched data to an output of an access device, wherein a number of access devices is less than or equal to ceiling ($\log_2$ B), where B is a number of ports in the multi-port SRAM;

a plurality of horizontal and vertical bit lines connected to outputs of the access devices, wherein the output of a first access device is connected via a horizontal bit line to the output of all first access devices of all cells in a same row, the output of a second access device is connected via a vertical bit line to the output of all second access devices of all cells in a same column; and a plurality of multiplexers each having a plurality of inputs and a data out port for selectably outputting data in the core cell array, wherein all vertical bit lines are connected to the inputs of at least one multiplexer and wherein all horizontal bit lines are connected to the inputs of at least a second multiplexer.

In accordance with the specific aspect of the present invention to achieve four read ports, each of the core cells is connected to two access means of the type well known in the art of SRAM design such as a static AND gate, a differentially connected FET pair, etc. The access means includes a gating means controlled by gating logic signals. While a gating logic signal is active (i.e., the "read" operation mode), the access means to which the gating logic signal corresponds transfers the data latched in the core cell to the output of the access means. The outputs of these two access means are the first and second data output terminals. The first of the output terminals is connected to the first output terminals of all other cells in the same row. The second of the output terminals is connected to the second output terminal of all other cells in the same column. The wires of the connections form the bit lines used for access of the core array cells via the network of connections of column and rows. Each of the bit lines is coupled to an input of each of four multiplexers through a sense amplifier. It will be understood by one skilled in the art of SRAM design that if the access means is a differential pair of transistors, each of the access terminals will be a differential pair and each of the bit lines will be a differential pair of wires.

This connection is sufficient to independently couple four different core cells to each of the four port output multiplexers. In general, there are two possible bit lines and selector controls which will accomplish this objective and which correspond to the solutions of a set of simultaneous Boolean equations.

Therefore, it is a particular object of the present invention to provide logic to solve these equations to select the correct access means and selector controls to couple the core cell specified by the port read address to the correct port output. This logic must guarantee that the selected bit lines do not conflict and also generate a correct multiplexer control based on which of the two possible choices of bit line has been picked.

In accordance with this aspect of our invention, a circuit to solve the simultaneous Boolean equations implements a tree walking algorithm which gives priority by port order, i.e., port 1 has highest priority in picking a bit line, followed by port 2, etc. in order. The access gating signal cannot be determined until the tree walk is finished which can be longer than the decoding needed in a conventional array. The strict priority order can generate conflicts and the circuit must modify the strict priority order to get the correct solution.

In another example of our invention, the circuit to select the bit lines and select controls could decide by giving priority in bit order, e.g., a bit with address=0 picks first, followed by bit 1, etc. with the strict priority order modified to prevent conflicts. This alternative embodiment walks a tree of possible solutions similar to the first embodiment with similar circuitry.

The choice as to which of the two is the preferred embodiment can depend on external decision criterion. The first embodiment has a data access speed advantage for the first port over the other ports. The second embodiment has less logic needed to select the bit lines but does not have the speed advantage.

Thus, a primary advantage of our invention is the fewer access means, bit lines and sense amplifiers needed to achieve multiport access. These factors can result in a smaller core area and lower word line loading depending on the layout ground rules for wire in relation to the active devices in the access means. In contrast, the conventional approach requires as many access means (usually device pairs) per cell as there are ports and each port has its own set of bit-lines and sense amplifiers; in addition, because each bit in a row is connected to the same word line, the word line sees the load represented by the gating means of each access device, e.g., the gate capacitance of an NMOS transistor.

BRIEF DESCRIPTION OF THE DRAWINGS

These and other objectives, advantages and features of the present invention will be apparent to one skilled in the art from the following Detailed Description and appended drawings, wherein.

DETAILED DESCRIPTION

The details of an embodiment of the present invention for a 4 port array using 2 bit lines per cell may be seen with reference to FIGS. 2–8. These Figures are drawn using the convention of time independent static logic for all logic functions to simplify the description, although those skilled in the art will appreciate that other embodiments including but not limited to dynamic or sense-amplifier differential logic are acceptable.

Figure 2:
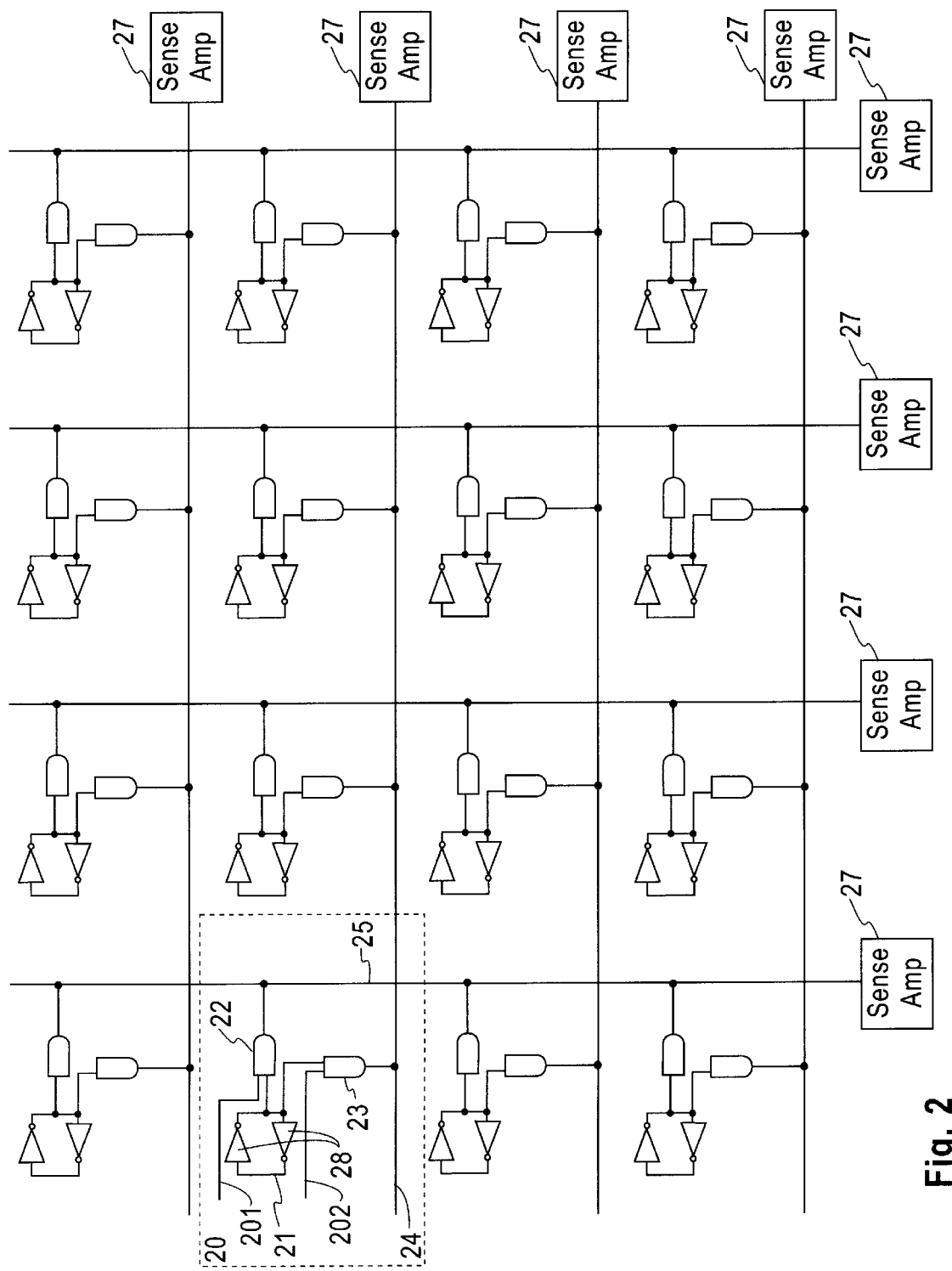
FIG. 2 depicts an example of a basic means of connecting 16 cells according to the present invention to achieve 4 independent access ports with only 2 access means per cell and 4 bits per bit line.

FIG. 2 depicts an example of a core cell array for a 4 port array in accordance with the present invention. As depicted, a representative core cell 20 includes a data latch function 21 comprising inverters 28. The core cell also includes AND gates 22, 23, which are the access means to couple a value held in the data latch 21 to the bit lines 24, 25. A gating signal 201 couples the value in the data latch 21 through the AND gate 22 to the vertical bit line 25; and gating signal 202 couples the value in the data latch through the AND gate 23 to the horizontal bit line 24. Four core cells are connected to each horizontal bit line 24 and vertical bit line 25. A sense amplifier 27 is connected to each of the bit lines for detecting and amplifying the stored data. The gating signals for each of the access means AND gates for the other 15 cells in the array are not shown but their connection is obvious with reference to representative cell 20.

Figure 3:
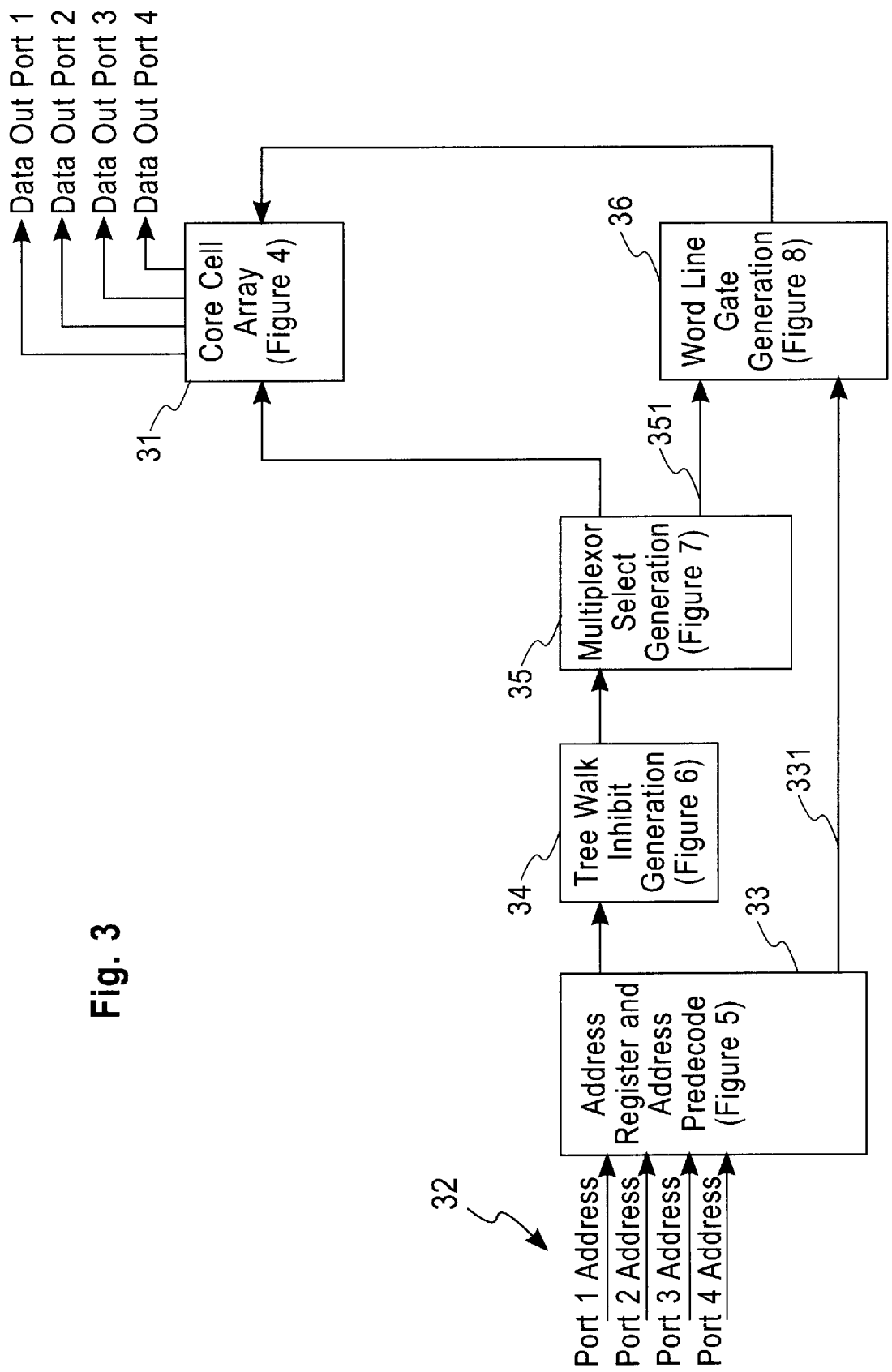
FIG. 3 depicts an example of a block diagram relating the relative positions of each of the following figures in the invention.

FIG. 3 depicts an example of a block diagram relating the relative positions of each of the subsequently described FIGS. (4–8). As depicted in FIG. 3, a core cell array [31] provides four data output ports. A read operation begins with the presentation of 4 addresses [32] to the address registers in the address register and address pre-decode logic [33]. These addresses (Port 1 Address . . . Port 4 Address) may be different or identical in any combination. The four addresses are pre-decoded by the address pre-decode logic [33] and the results of the pre-decode are presented to the Tree Walk Inhibit Generation Logic [34], the Multiplex Select Generation Logic [35] and the Word Line Gate Generation Logic [36]. The Tree Walk Inhibit Generation Logic [34] implements a tree walking algorithm which results in the generation of signals to inhibit the choices of the Multiplexer Select Generation Logic [35]. The gating signals for each of the access means of the core array are generated by the Word Line Gate Generation Logic [36] using the outputs [331] of the pre-decode logic [33] and the choice of multiplexer select [351] used for each port.

Figure 1:
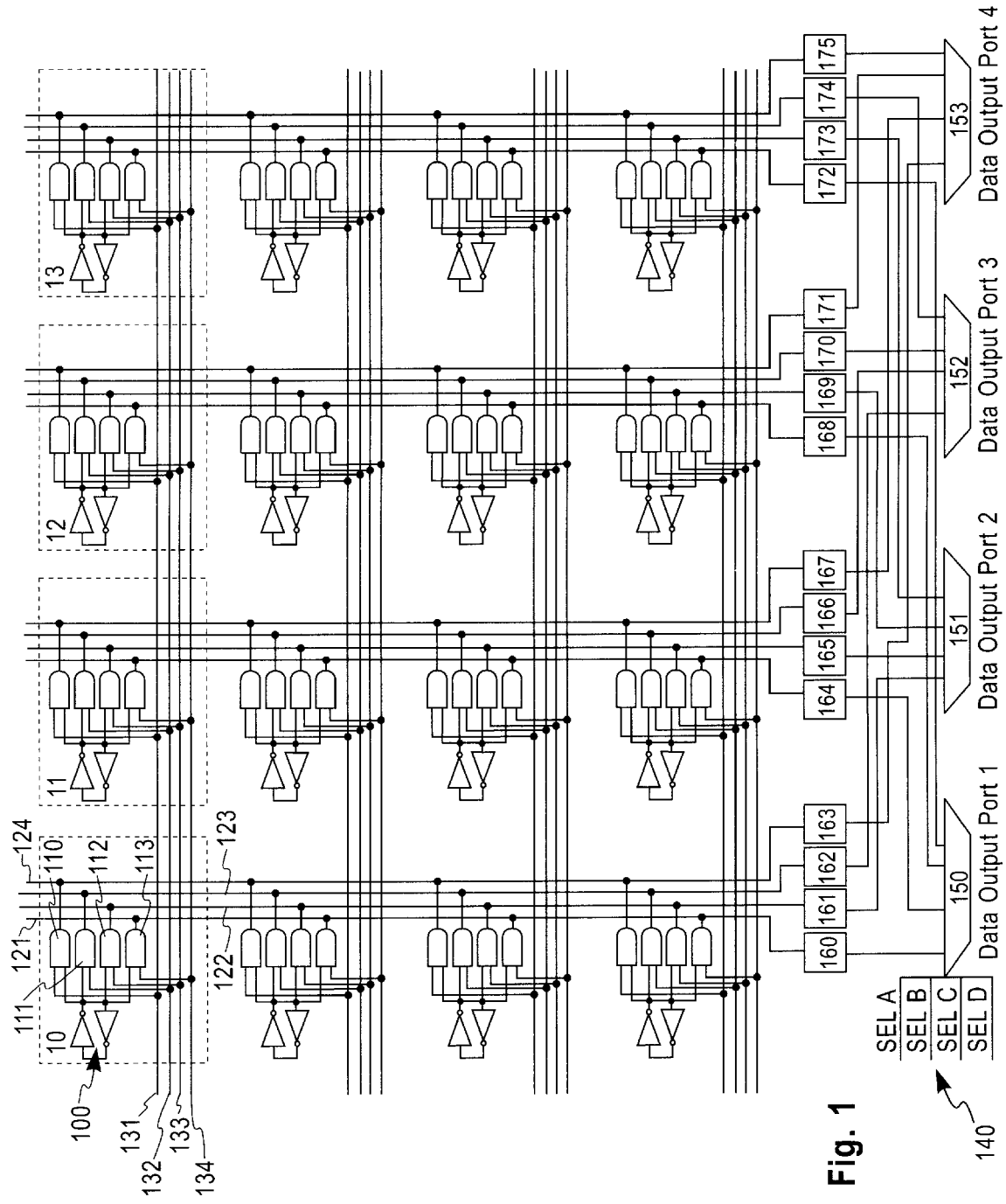
FIG. 1 shows a conventional 4 port SRAM with 4 bits per bit line and 4 bits per word line with a 4 way multiplexer (also called data selector or selector) to allow selection of one bit from 16 per access port.
Figure 4:
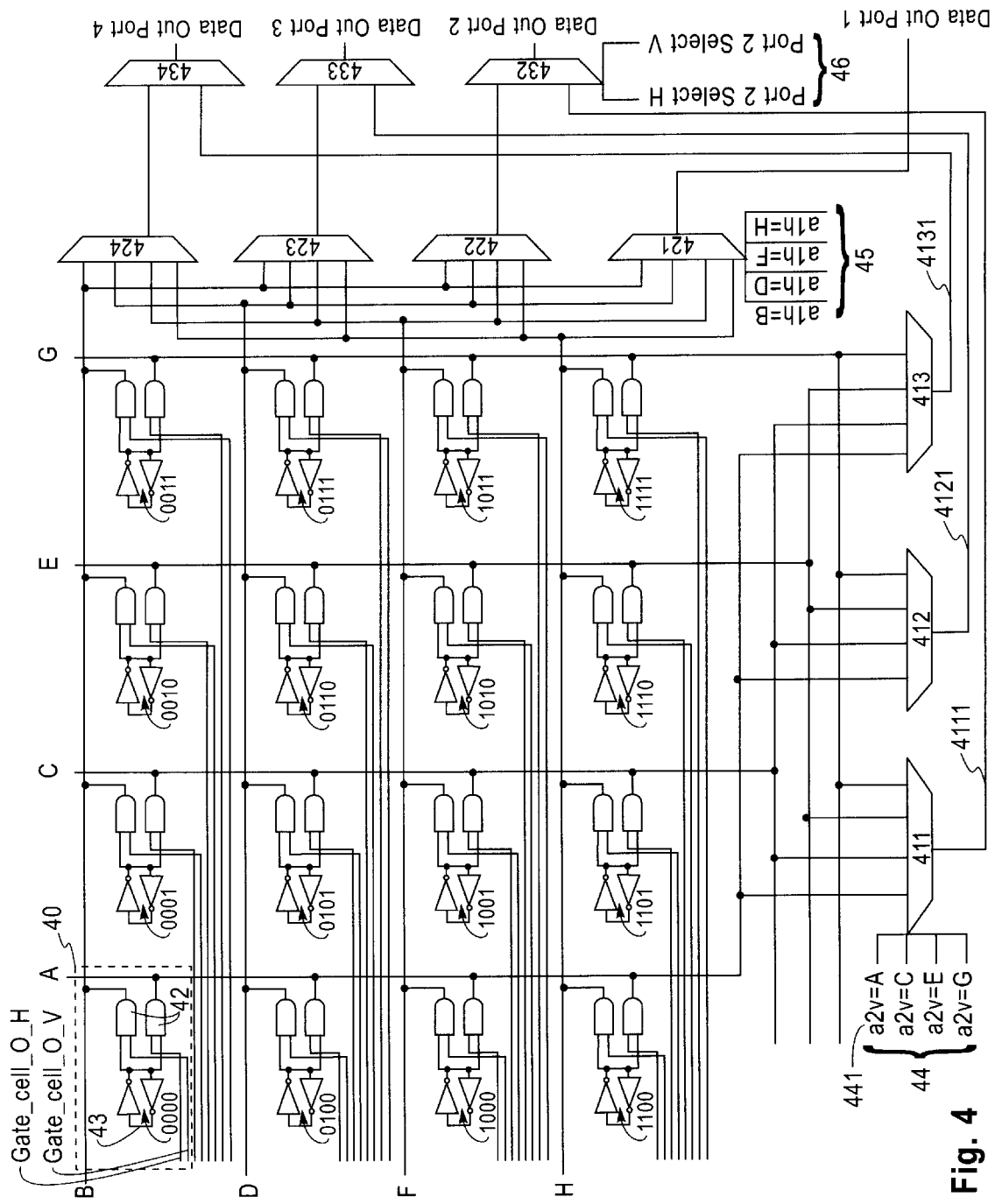
FIG. 4 depicts an example of a 16 cell geometry of FIG. 2 in complete detail including all access means and selectors needed to achieve the four port access.
Figure 5:
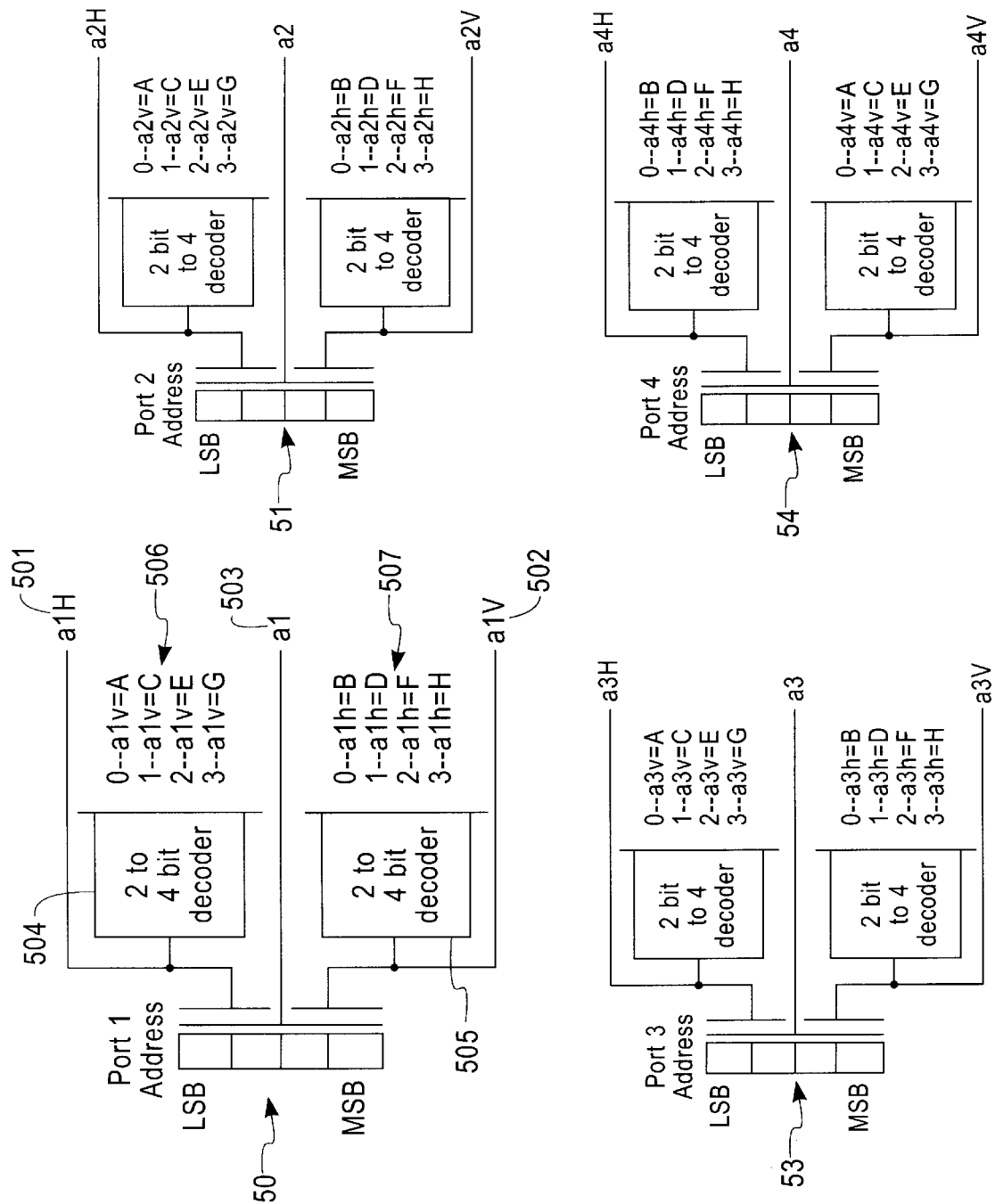
FIG. 5 depicts an example of the registers holding the read addresses of each port and the pre decode of these address bits needed for generation of the bit line and selector controls.

FIG. 4 depicts a more detailed example of the 16 cell geometry of FIG. 2 including gating signals and multiplexers to achieve a four port access. Each cell may be identified by a unique 4 bit address (0000 . . . 1111) shown inside each latch element 43. This corresponds to an index {i,j} identifying the row and column of each bit. A representative core cell 40 is represented by the address 0000. Each of the cells has two access means, shown in this example as AND gates 42. When a gate signal is active (e.g., Gate_cell_0_H) then the value in the latch is coupled to the output terminal and to the connected bit line. For the 16 bit array shown, there are 32 AND gate access means which require a total of 32 gating signals and a total of 8 bit lines (A . . . H). If the extra 4 wires per row and 1 wire per column (as compared to FIG. 1) cannot be contained in the cell area, then the total cell area may not be smaller than the conventional approach. The bit lines are divided into "horizontal" (B, D, F, H) and "vertical" lines (A, C, E, G), where the horizontal bit lines connect cells in the same row and the vertical bit lines connect cells in the same column. Each of the eight bit lines is labeled with a unique letter A–H. Each horizontal bit line is connected to 4 multiplexers (421, 422, 423, 424), corresponding to each port. In a preferred embodiment, since the algorithm used to select the bit lines always assigns port 1 to a horizontal bit line, the vertical bit lines are connected to only 3 multiplexers (411, 412, 413). The output of the horizontal and vertical bit line multiplexers for each port (except port 1) are then selected with a 2 way multiplexer (432, 433, 434). In order to connect each of the vertical bit line multiplexers (411, 412, 413) to the respective final 2 way selector (432, 433, 434), the multiplexer output lines (4111, 4121, 4131) turn 90 degrees, as shown. Each multiplexer is of the type which has orthogonal inputs, which when one is active couples the corresponding input to the output terminal, e.g., if Sel A 441 is active, bit line A is coupled to the output through the sense-amplifier (not shown). The select for the horizontal multiplexers (421, 422, 423, 424) is derived from the decode of the horizontal component of that port data address (FIG. 5). For clarity, the select 45 is shown only for the multiplexer for one port 421, but all ports have similar selects. Similarly, the selects for the vertical selectors are derived from the decode of the vertical component of the port data address (FIG. 5). Again, for clarity, the select 44 is shown only for the multiplexer for one port 411, but all ports have similar selects. The select signal for the final selectors (432, 433, 434) is made by the logic explained below. This means a total of 34 select signals must be generated to couple the data from the up to 4 cells specified in the port read addresses to the output terminals (Data Out Port 1 . . . Data Out Port 4) of the Data Out port 1–4 multiplexers (421, 432,433,434). The actual number of specified cells can be any number between 1 and 4 since one or more of the port data addresses may be identical.

The select signals for the four-way multiplexers in FIG. 4 can be derived by simple decoding of the horizontal and vertical index components of the cell address (0000 . . . 1111). As shown, the selection of the horizontal bit line for port 1 is made by multiplexer 421 using the decoded address as generated by a decoder 505 (FIG. 5). The select control for the 2 way horizontal/vertical selection is more complicated and is detailed below.

Note also that if the alternative algorithm mentioned above, which selects based on bit order priority (rather than port order), the missing multiplexers for the vertical bit line selection for port 1 as well as the port 1 horizontal/vertical selection must be added to the core array of FIG. 4.

Those skilled in the art will appreciate that the 4-port two dimensional i.e., N×M array of core cells depicted in FIG. 4 is a species of the more general case of an N×M×P array, where N is the number of rows, M is the number of columns and P is the number of planes in the array (for P=1). One of skill in the art will appreciate how the connection scheme can be generalized to N index values to provide up to $2^N$ access ports. For example, let each cell be numbered with a unique index {n,m,p}. In an 8-port SRAM, which could be configured as a 4×4×4 array of core cells, each core cell is connected to ceiling($Log_2 8$)=3 access means with gating means, the output of each of the access means are the first, second, and third data output terminals. The first of the output terminals is connected to the first output terminals of all other cells whose index number contains the same value of n. The second of the output terminals is connected to the second output terminal of all other cells whose index number contains the same value of m. The third of the output terminals is connected to the third output terminals of all other cells whose index number contains the same value of p. The wires of the connections form the bit lines used for access of the core array cells via the network of connections. As is conventional, each of the bit lines is coupled to an input of each of eight multiplexers through a sense amplifier. This connection is sufficient to independently couple eight different core cells to each of the eight port output multiplexers to form an eight port SRAM array.

An important part of the present invention is logic to pick the correct values for the gating signals and the final horizontal/vertical select multiplexer select signals. The correct choice for these signals is not obvious because although some combinations of port read addresses have only one correct value, many combinations do not have a unique solution and so some criterion must be implemented for deciding which of the possible solutions to use. Also, the same bit can be accessed for multiple ports, which requires the algorithm to recognize this and pick the same bit line for all ports accessing the same bit. There are two preferred embodiments, picking in port priority order or picking in bit priority order. Shown here is a solution when picking in port priority order and the first port always picks the horizontal bit line. Although this is a problem in the solution of simultaneous Boolean equations, the problem is formulated as a tree walking problem to inhibit the generation of conflicting solutions. Appendix I (which is hereby incorporated herein by reference in its entirety) includes an example of an algorithm (as expressed in C programming language pseudo-code) for walking the tree of possible bit line and multiplexer select values and picking a correct solution. Appendix II (which is hereby incorporated herein by reference in its entirety) shows an example of a C program which simulates the algorithm for all 65556 possible address combinations and shows that a correct solution results for each case.

Thus, the present invention includes features that can be implemented as software tangibly embodied on a computer program product or program storage device for execution on a conventional processor (not shown) provided with a memory device in accordance with the present invention. Those skilled in the art will appreciate that other procedure-oriented and object-oriented (OO) programming environments can also be employed.

Those skilled in the art will also appreciate that methods of the present invention may be implemented as software for execution on a computer or other processor-based device. The software may be embodied on a magnetic, electrical, optical, or other persistent program and/or data storage device, including but not limited to core, read-only memory (ROM), programmable read-only memory PROM, flash memory, or battery backed random access memory (RAM).

FIG. 5 depicts an example of the registers holding the read addresses of each port and the pre-decode of these address bits for generation of the bit line and selector controls. As depicted, a simple decoding of each address into a "hot-one" representation, actually a 2-of-8 code, can be used for the four way multiplexer select signals (a1H . . . a4H and a1V . . . a4V) in FIG. 4 (44, 45) and the word line select generation of FIG. 8. The address of the data to be returned on each port is held in a port address register (50, 51, 53, 54). Each port address is sent to later logic in three parts, the full 4 bit address, for example the full 4 bit address a1 (503) for port 1 and the two bit horizontal a1H (501) and vertical a1V (502) fields. Two 2-to-4 bit decoders (504, 505) are used to determine which horizontal and vertical bit line should be used to access the contents of the addressed cell.

Figure 6:
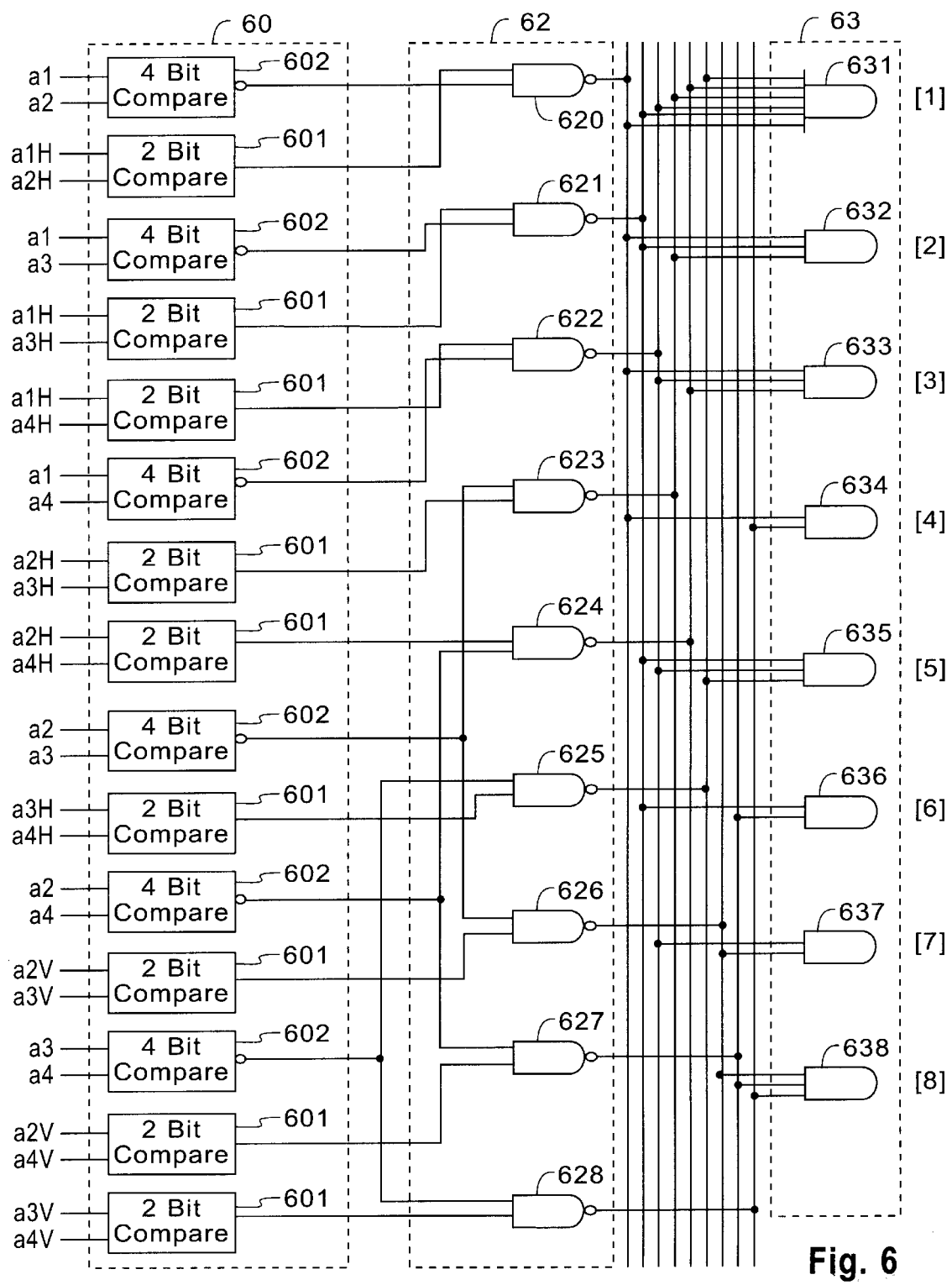
FIG. 6 depicts an example of a logic embodiment of the circuit which in effect walks the tree of possible bit line and selector choices and generates the inhibit signals to prevent conflicting choices based on port 1 having first choice and always picking the horizontal bit line.

FIG. 6 depicts an example of logic which in effect walks the tree of possible bit line and selector choices and generates inhibit signals to prevent conflicting choices based on port 1 having first choice and always picking the horizontal bit line. As depicted, the array of compares 60 comprises a plurality of two-bit comparators 601 whose outputs are true if the inputs are equal and four bit comparators 602 whose outputs are false if both inputs are equal. Each of the two bit compares 601 checks for a particular case of bit line conflict, e.g., the horizontal component of one port address is the same as the horizontal component of another port address and similarly for the vertical components. However, if all 4 bits of two port addresses are identical, this inhibits the detection of a conflict. This inhibit is done in the first column of AND circuits 62. The connections of the AND circuits 63 corresponds to a path from a root to a leaf of the tree of all possible horizontal and vertical bit line selections for the particular 4 bit addresses. There are eight possible paths corresponding to AND gates 631–638. The outputs of these ANDs [1–8] will be "high" for the non-null leaf nodes of the tree algorithm of Appendix I.

Figure 7:
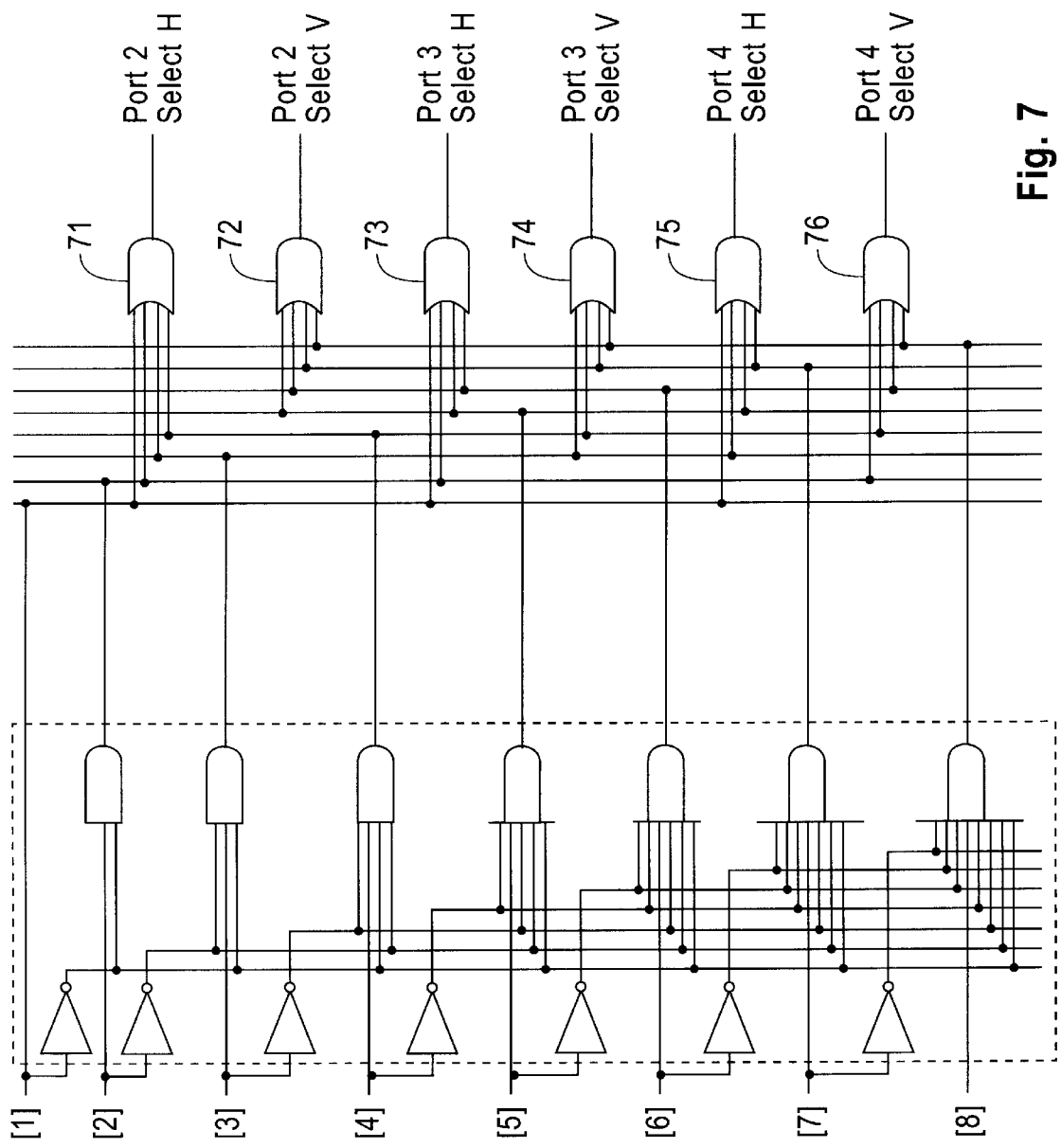
FIG. 7 depicts an example of logic to generate the correct multiplexer select signals to be connected to the port multiplexers of FIG. 4.

FIG. 7 depicts an example of logic to generate the correct multiplexer select signals to be connected to the port multiplexers of FIG. 4. As depicted, a logic block 70 is used to pick a first non-null value (positive or "high" value) and to inhibit all others. The value of this logic 70 is then used to generate a horizontal/vertical multiplexer select for each port (except port 1, which in a preferred embodiment is always horizontal). For example, an OR gate 71 is connected to all possible results of logic 70 for which the path through the tree results in a selection of the horizontal bit line for port 2. Similar connections corresponding to each leaf node in the tree are made to the remaining OR circuits (72, 73, 74, 75, 76).

Figure 8:
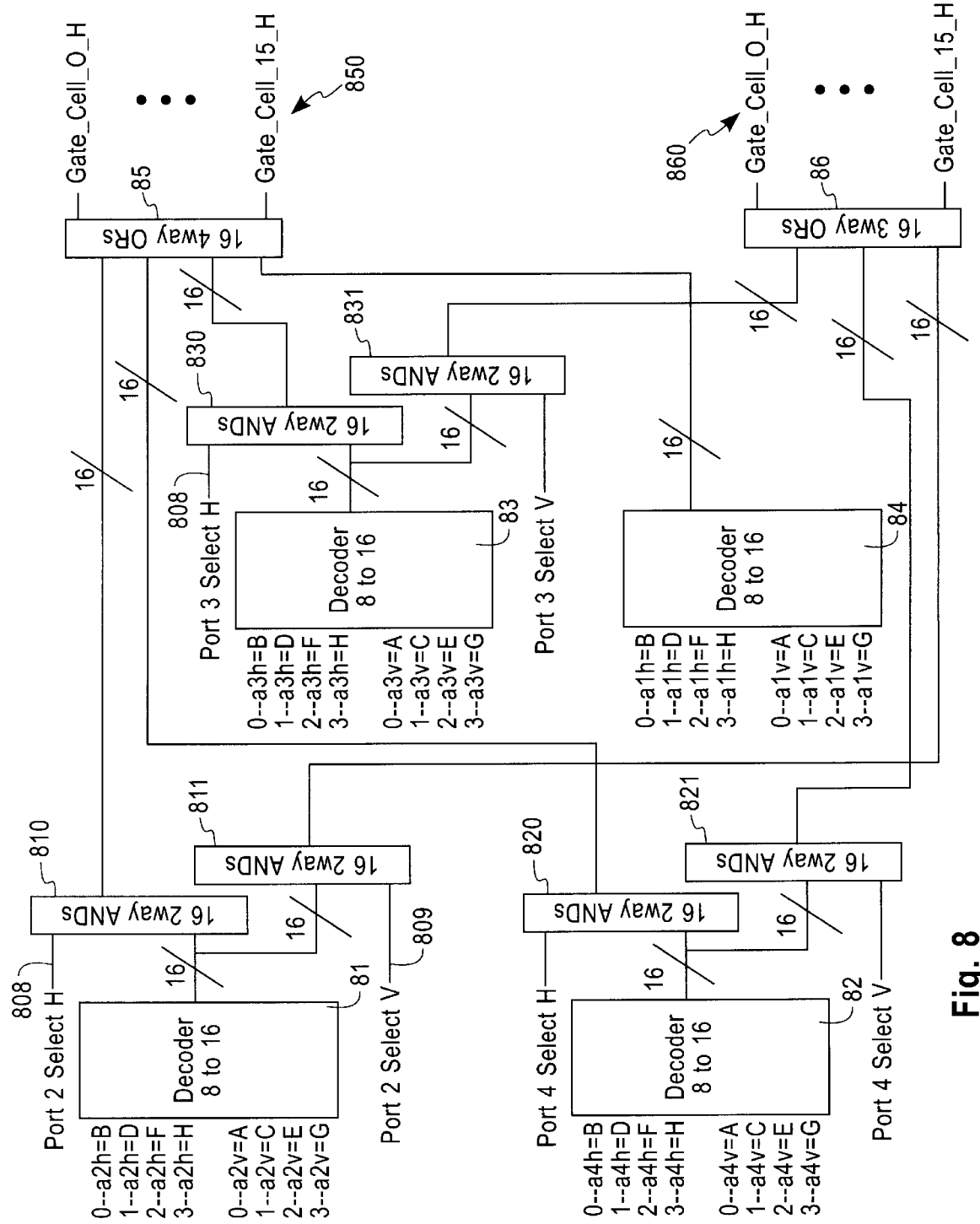
FIG. 8 depicts an example of logic to generate a correct access gate means to be connected to the cell access gate means of FIG. 4.

FIG. 8 depicts an example of logic for generating a correct access gate means to be connected to the cell access gate means of FIG. 4. Specifically, FIG. 8 shows the full decoding of each bit value and the generation of the 32 access means gating signals. For example, a partially decoded port 2 address is input to an 8-to-16 decoder 81 to generate a fully decoded value. The 16 bits (output from the decoder 81), only one of which is true, are coupled to AND gate arrays (810, 811). The decoded values are ANDed with the horizontal 808 and vertical 809 select signals for port 2 generated by the logic of FIG. 7. The value generated is combined with the results of similar logic for the other three ports by OR circuits (85, 86) whose outputs (850, 860) are coupled to the access means gating signals for each core cell (FIG. 4).

Although the total amount of logic needed to select the gating and select values is large compared to the 16 cells of the array shown—this logic need only be implemented once—no matter how large the actual array implemented by the conventional means of tiling the 16 bit core array.

An alternative embodiment where the bit lines are selected in bit priority order is provided by a C programming language code simulation in Appendix III, which is hereby incorporated by reference in its entirety. This code corresponds to a hardware implementation which first decodes the four port addresses to a 1-of-16 representation and then OR'S the result to get a 16 bit value containing from 1-to-4 Ones. A solution space is used in which the bit with the value closest to "0000" will use the horizontal bit line. The tree of all possibilities resulting from this choice is constructed and the values which conflict are inhibited. The first viable solution in bit order from "0000" is picked, with the complication that there may be 1, 2, 3 or 4 unique addresses for the 4 port data addresses presented. This program shows that all 65K possibilities yield a correct, unique solution.

Figure 9:
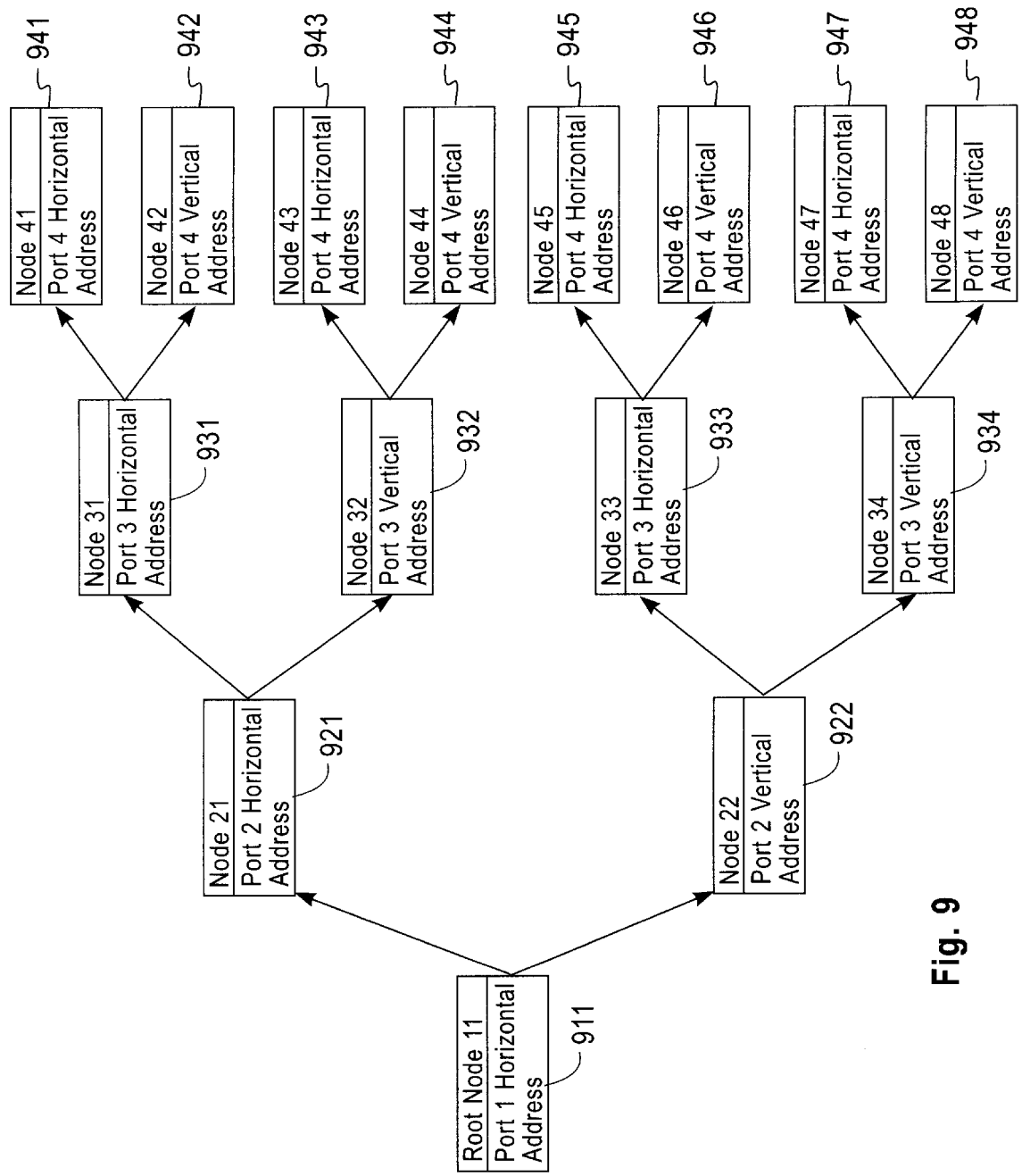
FIG. 9 depicts an example of a convention for representing the address tree used in the algorithm flowchart of FIGS. 10 and 11.
Figure 10A:
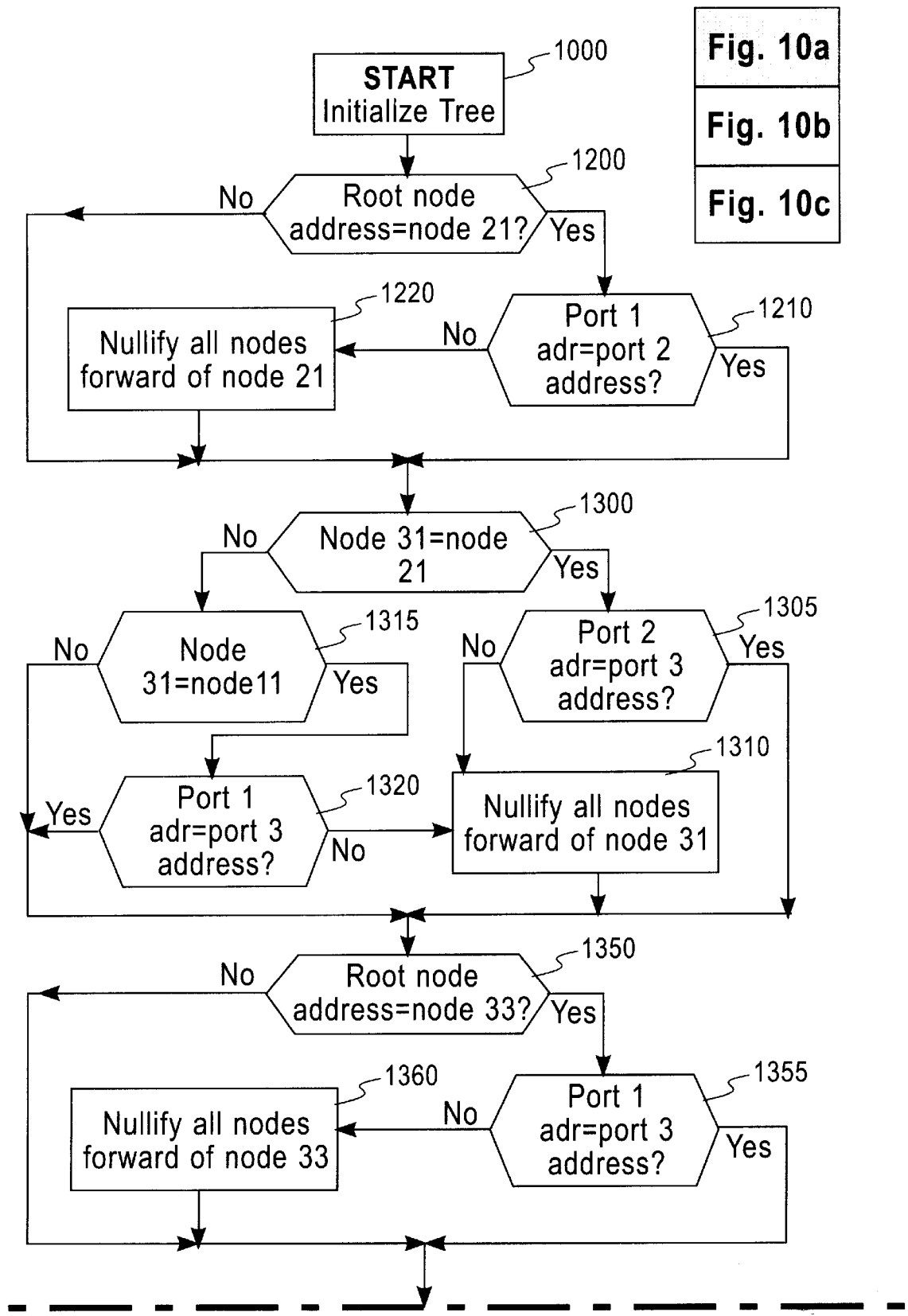
FIGS. 10 and 11 depict examples of flowcharts for a sequential representation of the bit line and multiplexer select generation algorithm represented in the hardware embodiment of FIGS. 3–8.
Figure 10B:
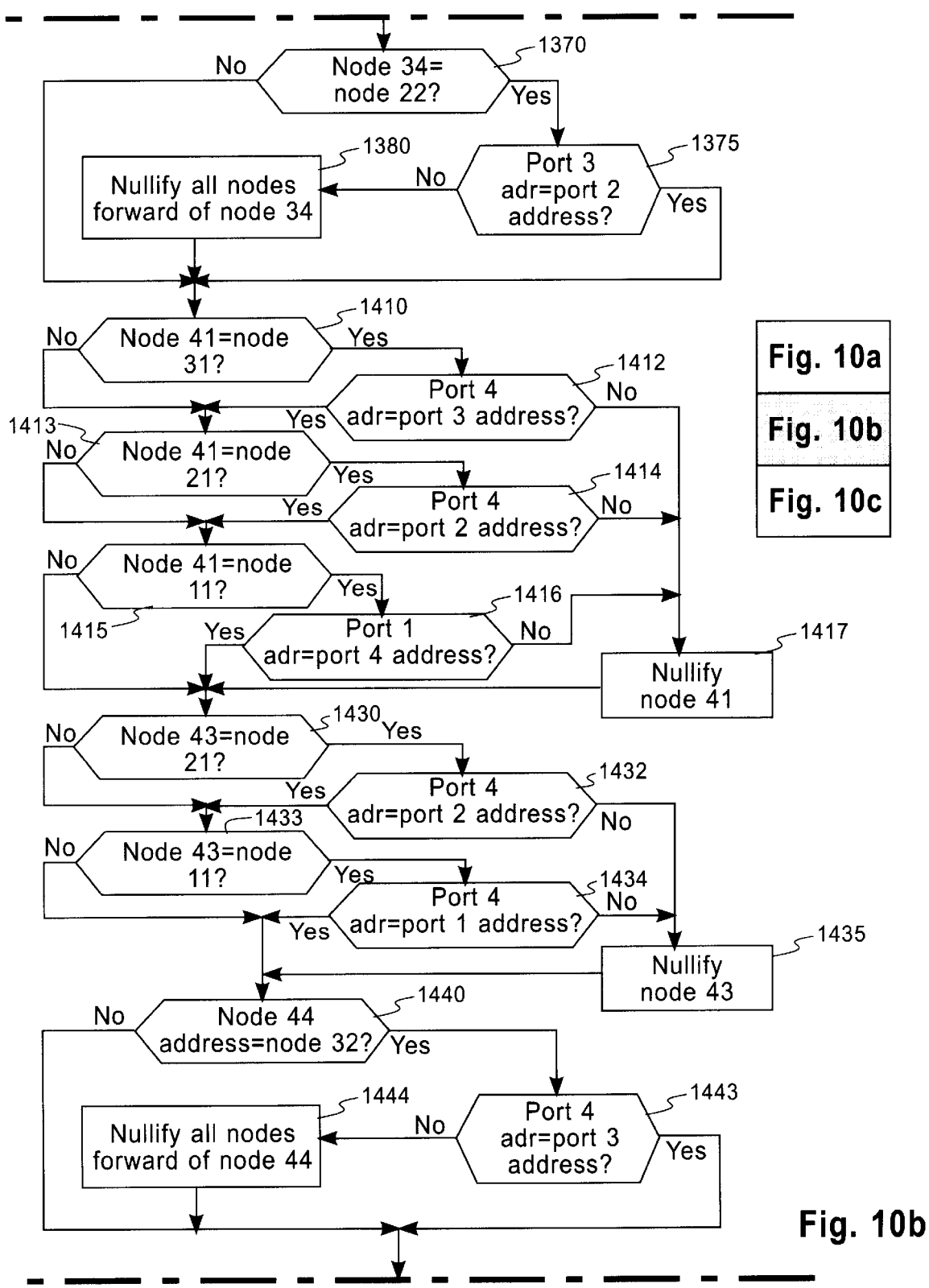
Figure 10C:
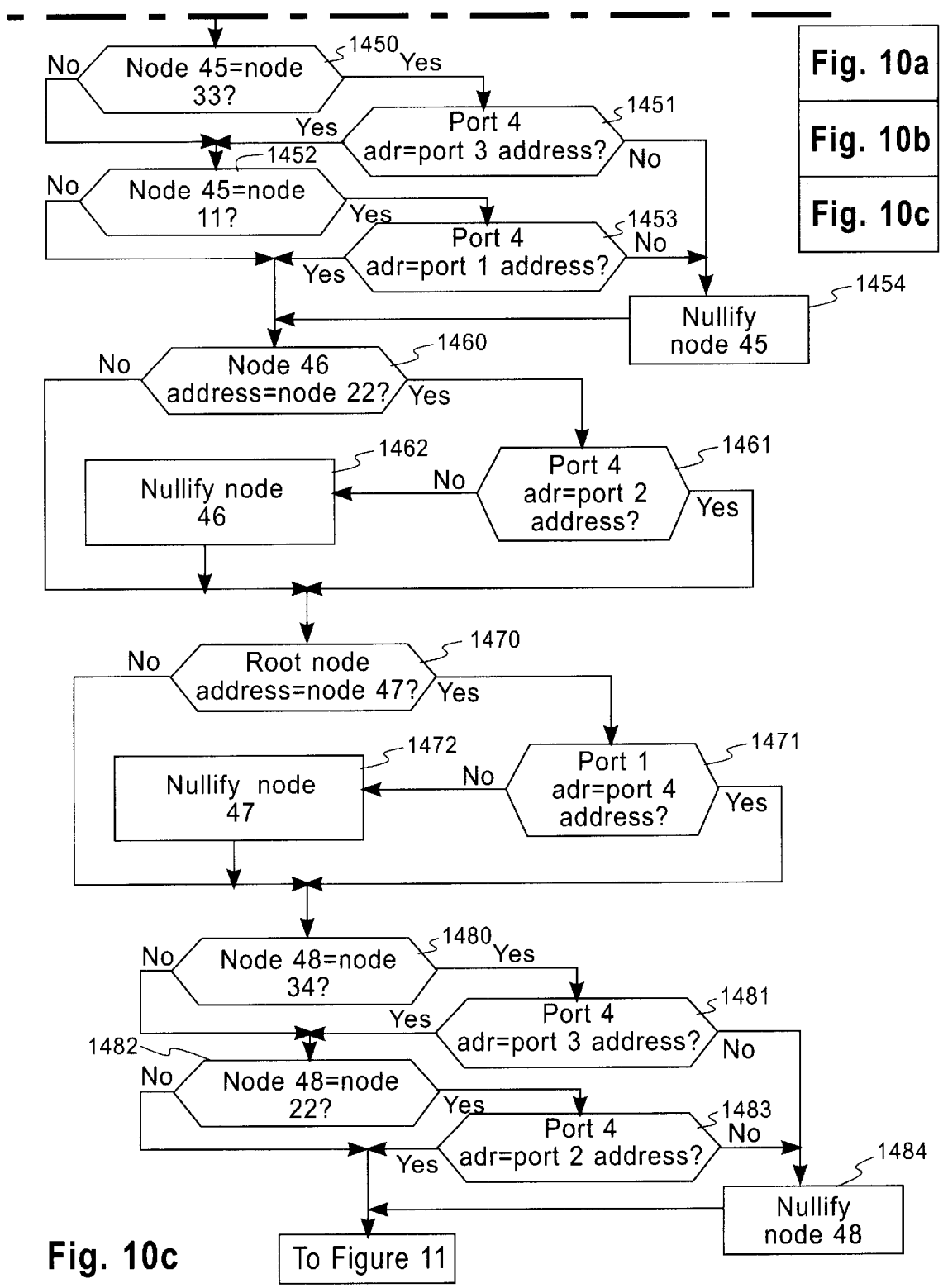
Figure 11:
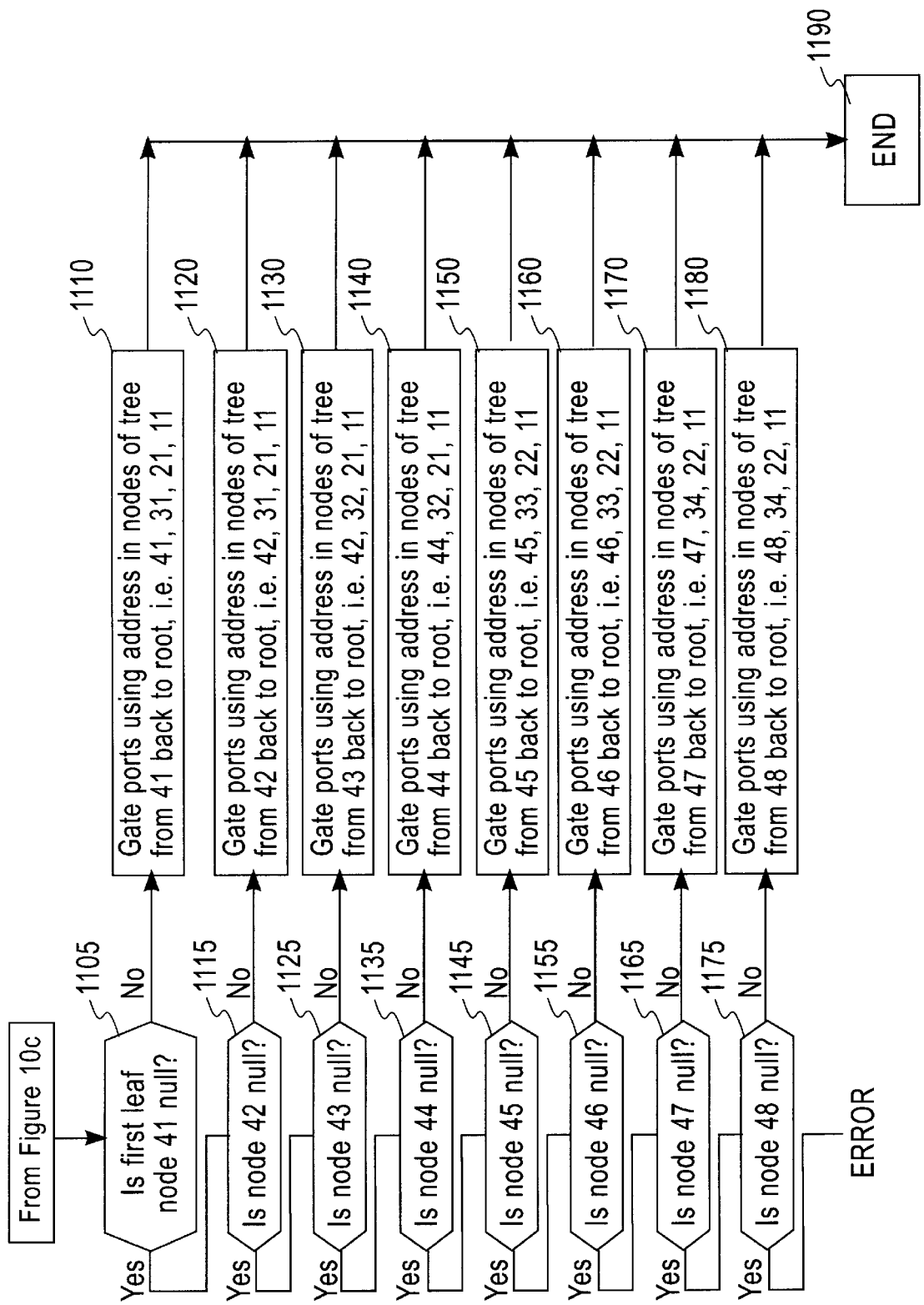

FIG. 9 depicts an example of a tree representation with node numbers and the values to which each node is initialized. As depicted, the root node 11 (911) is set to the Port 1 Horizontal Address (this is due to a1 having highest priority and always choosing horizontal bit line). The root node 11 (911) has two child nodes: Node 21 (921) is set to the Port 2 Horizontal Address; and Node 22 (922) is set to the Port 2 Vertical Address. Node 21 (921) has two child nodes: Node 31 (931) is set to the Port 3 Horizontal Address; and Node 32 (932) is set to the Port 3 Vertical Address. Node 31 (931) has two child nodes: Node 41 (941) is set to the Port 4 Horizontal Address; and Node 42 (942) is set to the Port 4 Vertical Address. Node 32 (932) has two child nodes: Node 43 (943) is set to the Port 4 Horizontal Address; and Node 44 (944) is set to the Port 4 Vertical Address. Similarly, Node 22 (922) has two child nodes: Node 33 (933) is set to the Port 3 Horizontal Address; and Node 34 (934) is set to the Port 3 Vertical. Node 33 (933) has two child nodes: Node 45 (945) is set to the Port 4 Horizontal Address; and Node 46 (946) is set to the Port 4 Vertical Address. Node 34 (934) has two child nodes: Node 47 (947) is set to the Port 4 Horizontal Address; and Node 48 (948) is set to the Port 4 Vertical Address FIGS. 10 and 11 represent a sequential flowchart of the pseudo-code algorithm which follows. It must be emphasized that a preferred hardware embodiment does not implement this sequentially (i.e., as clocked behavioral logic) but rather as parallel, combinational logic (FIG. 6).

Referring now to FIG. 10, in step 1000, the tree is initialized (e.g., as per FIG. 9). By way of overview, in the remaining steps, the tree is "walked" from root to leaves to identify bit line conflicts and all nodes in a branch containing a conflict are set to null. Each of the two bit (node-to-node) compares checks for a particular case of bit line conflict, e.g., the horizontal address component of one port address is the same as the horizontal component of another port address and similarly for the vertical components. However, if all 4 bits of two port addresses are identical, the detection of a conflict is inhibited.

As depicted, in step 1200, the node 21 address is compared is compared with the root node 11 address. If there is no conflict then the process proceeds to step 1300. If there is a conflict, in step 1210, the port 1 address is compared with the port 2 address. If there is a match then the process proceeds to step 1300.

If there is no match, in step 1220 all child nodes of node 21 are set to null and the process proceeds to step 1300.

In step 1300, the node 31 address is compared with the node 21 address. If there is a conflict, in step 1305, the port 2 address is compared with the port 3 address. If there is a match then the process proceeds to step 1300. If there is no match, in step 1310 all child nodes of node 31 are set to null and the process proceeds to step 1350. If in step 1300, there is no conflict, in step 1315, the node 31 address is compared with the node 11 address. If there is a conflict, in step 1320, the port 1 address is compared with the port 3 address. If there is a match then the process proceeds to step 1350. If there is no match, in step 1310 all child nodes of node 31 are set to null and the process proceeds to step 1350. In step 1350, the node 33 address is compared with the root node 11 address. If there is no conflict then the process continues at step 1370. If there is a conflict, in step 1355, the port 1 address is compared with the port 3 address. If there is a match then the process proceeds to step 1370. If there is no match, in step 1360 all child nodes of node 33 are set to null and the process proceeds to step 1370. In step 1370, the node 34 address is compared is compared with the node 22 address. If there is no conflict then the process continues at step 1410. If there is a conflict, in step 1375, the port 2 address is compared with the port 3 address. If there is a match then the process proceeds to step 1400. If there is no match, in step 1380 all child nodes of node 34 are set to null and the process continues at step 1410.

In step 1410, the node 41 address is compared with the node 31 address. If there is a conflict, in step 1412, the port 4 address is compared with the port 3 address. If there is a match then the process proceeds to step 1413. If there is no match, in step 1417 node 41 is set to null and the process proceeds to step 1430. If in step 1410, there is no conflict, in step 1413, the node 41 address is compared with the node 21 address. If there is a conflict, in step 1414, the port 4 address is compared with the port 2 address. If there is a match then the process proceeds to step 1415. If there is no match, in step 1417 node 41 is set to null and the process proceeds to step 1430. In step 1415, the node 41 address is compared with the node 11 address. If there is a conflict, in step 1416, the port 4 address is compared with the port 1 address. If there is a match then the process proceeds to step 1430. If there is no match, in step 1417 node 41 is set to null and the process proceeds to step 1430. In steps 1430–1484, the remaining leaf nodes with potential conflicts are similarly checked. After step 1484, the process proceeds as depicted in FIG. 11.

Referring now to FIG. 11, those leaf nodes which contain null values effectively inhibit the use of the corresponding bit line. Starting at the first leaf node which contains a non-null value, pick that node as the bit line to use for port 4 (since each leaf node corresponds to a port 4 horizontal or vertical address); and pick the bit lines for the other ports as determined by the path back through the tree from the port 4 address leaf node to the root.

As depicted, in step 1105, it is determined whether node 41 is null. If no, then in step 1110, gate the ports using the addresses in the nodes of the tree from leaf node 41 back to the root, i.e., node 41, node 31, node 21 and node 11; and the process ends at step 1190.

If node 41 is null, then in step 1115, it is determined whether node 42 is null. If no, then in step 1120, gate the ports using the addresses in the nodes of the tree from leaf node 42 back to the root, i.e., node 42, node 31, node 21 and node 11; and the process ends at step 1190.

If node 42 is null, then in step 1125, it is determined whether node 43 is null. If no, then in step 1130, gate the ports using the addresses in the nodes of the tree from leaf node 43 back to the root, i.e., node 43, node 32, node 21 and node 11; and the process ends at step 1190.

If node 43 is null, then in step 1135, it is determined whether node 44 is null. If no, then in step 1135, gate the ports using the addresses in the nodes of the tree from leaf node 44 back to the root, i.e., node 44, node 32, node 21 and node 11; and the process ends at step 1190.

If node 44 is null, then in step 1145, it is determined whether node 45 is null. If no, then in step 1150, gate the ports using the addresses in the nodes of the tree from leaf node 45 back to the root, i.e., node 45, node 33, node 22 and node 11; and the process ends at step 1190.

If node 45 is null, then in step 1155, it is determined whether node 46 is null. If no, then in step 1160, gate the ports using the addresses in the nodes of the tree from leaf node 46 back to the root, i.e., node 46, node 33, node 22 and node I 1; and the process ends at step 1190.

If node 46 is null, then in step 1165, it is determined whether node 47 is null. If no, then in step 1170, gate the ports using the addresses in the nodes of the tree from leaf node 47 back to the root, i.e., node 47, node 34, node 22 and node I ; and the process ends at step I 190.

Finally, If node 47 is null, then in step 1175, it is determined whether node 48 is null. If no, then in step 1180, gate the ports using the addresses in the nodes of the tree from leaf node 46 back to the root, i.e., node 46, node 33, node 22 and node I1, and the process ends at step 1190. If in step 1175, node 48 (the final leaf node) is determined to be null then an ERROR is generated.

Appendix I: Psuedo-Code for Tree Walk

Assumptions: Priority is in Port order (i.e. p1>p2>p3>p4); port 1 picks horizontal bit line always Solution: walk the tree in priority order; if a conflict develops, mark it. Data representation: The bit lines are as labeled in FIG. 4, with the appropriate horizontal and vertical lines indicated:. a1 represents the port 1 address; a2 represents the port 2 address; etc; a1h represents the 2 bits which select a horizontal bit line for the port 1 address; and a1v represents the 2 bits which select a vertical bit line for port 1 address (a2h, a3h, a4h and a2v, a3v, a4av likewise for the other port addresses).

There is only one horizontal and one vertical bit line value for each of the 16 possible addresses. Each node of the tree can contain either a valid horizontal or vertical bit line value or be invalid or null.

Psuedo-code

/*initialize the tree*/
{
node 11=a1h; /* this is due to a1 having highest priority and always choosing horizontal bit line*/
node 21=a2h;
node 22=a2v;
node 31=a3h,
node 32=a3v;
node 33=a3h;
node 34=a3v;
node 41=a4h;
node 42=a4v;
node 43=a4h;
node 44=a4v;
node 45=a4h;
node 46=a4v;
node 47=a4h;
node 48=a4v;
/*walk the tree from root to leaves to find bit line conflicts and set all nodes in a branch containing a conflict to null*/

```
if ((node 21==node 11)&&(a1!=a2)){node 21=null;
    node 31=null;
    node 32=null;
    node 41=null;
    node 42=null;
    node 43=null;
    node 44=null;}
if (((node 31==node 21)&&(a3!=a2))||((node 31==node
    11)&&(a3!=a1))){node 31=null;
    node 41=null;
    node 42=null;}
if ((node 33==node 11)&&(a3!=a1)){node 33=null;
    node 45=null;
    node 46=null;}
if((node 34==node 22)&&(a3!=a2)){node 34=null;
    node 47=null;
    node 48=null; }
if (((node 41==node 31)&&(a4!=a3))||((node 41==node 21
    )&&(a4!=a2))||((node 41==node 11)&&(a4!=a1))){
    node 41=null;}
if (((node 43==node 21)&&(a4!=a2))||((node 43==node
    11)&&(a4!=a1))){
    node 43=null;}
if ((node 44==node 32 )&&(a4!=a3)){
    node 44=null;}
if (((node 45==node 33)&&(a4!=a3))||((node 45==node
    11)&&(a4!=a1))){
    node 45=null;}
if ((node 46==node 22 )&&(a4!=a2))}
    node 46=null;}
if ((node 47==node 11)&&(a4!=a1))}
    node 47=null;}
if (((node 48==node 34)&&(a4!=a3))||((node 48==node
    22)&&(a4!=a2))){
    node 48=null;}
/*those leaf nodes which contain null values effectively
inhibit the use of the corresponding bit line. Starting at the
first leaf node which contains a non-null value, pick that as
the bit line to use for port 4 (since each leaf node corre-
sponds to a port 4 horizontal or vertical address) ;and pick
the bit lines for the other ports as determined by the path
back through the tree from the port 4 address leaf node to the
root.
the naming convention used is sel1=value of mux select for
port 1, sel2 for port 2, etc.*/
if (node 41 !=null){sel4=node 41;
    sel3=node 31;
    sel2=node 21;
    sel1=node 11;}
    else {
if (node 42 !=null){sel4=node 42;
    sel3=node 31;
    sel2=node 21;
    sel1=node 11;}
    else {
if (node 43 !=null){sel4=node 43;
    sel3=node 32;
    sel2=node 21;
    sel1=node 11;}
    else {
if (node 44 !=null){sel4=node 44;
    sel3=node 32;
    sel2=node 21;
    sel1=node 11;}
    else {
if (node 45 !=null){sel4=node 45;
    sel3=node 33;
    sel2=node 22;
    sel1=node 11;}
    else {
if (node 46 !=null){sel4=node 46;
    sel3=node 34;
    sel2=node 22;
    sel1=node 11;}
    else {
if (node 47 !=null){sel4=node 47;
    sel3=node 34;
    sel2=node 22;
    sel1=node 11;}
    else {
if (node 48 !=null)}sel4=node 48;
    sel3=node 34;
    sel2=node 22;
    sel1=node 11;}
}}}}}}}
}
```

Appendix II: Simulation of Port Order Bit Line Selection Algorithm

```
#include<stdio.h>
int a[4];
int ax[4];
int ay[4];
int sel[4];/* identifier of mux select for port n*/
char hv_sel[4];/*horizontal or vertical used for select*/
int inhibit;
int ix,num,err,ss;
/*Four port sram with 4 cells per bit line for a 4x4 square*/
main( )
{
num=0;
for (a[0]=0, a[0]<16;a[0]++){
    for (a[1]=0; a[1]<16;a[1]++){
        for (a[2]=0; a[2]<16;a[2]++){
            for (a[3]=0; a[3]<16;a[3]++)}
for (ix=0; ix<4; ix++){
    ax[ix]=(a[ix]& 0xC)>>2;
    ay[ix]=a[ix]& 0x3;
/*
(void)printf ("a ax ay % d % d % d % d\n",ix, a[ix], ax[ix],
    ay[ix]);*/
/*initialize to invalids*/
sel[ix]=33;hv_sel[ix]='N';
}
/*all addresseses are generated at this point—now to select
which bit line to use and generate mux select for each
port*/
/*clear inhibit storage*/
inhibit=0xFF;
/*generate inhibits where 0=inhibit*/
if ((ax[0]==ax[1])&&(a[0]!=a[1])){inhibit=inhibit & 0x0F;
}
if ((ax[0]==ax[2])&&(a[0]!=a[2])){inhibit=inhibit & 0x33;
}
if ((ax[0]==ax[3])&&(a[0]!=a[3])){inhibit=inhibit & 0x55;
}
if ((ax[1]==ax[2])&&(a[1]!=a[2])){inhibit=inhibit & 0x3F;
}
```

```c
if ((ax[1]==ax[3])&&(a[1]!=a[3])){inhibit=inhibit & 0x5F;
}
if ((ay[1]==ay[2])&&(a[1]!=a[2])){inhibit=inhibit & 0xFC; }
if ((ay[1]==ay[3])&&(a[1]!=a[3])){inhibit=inhibit & 0xFA; }
if ((ax[2]==ax[3])&&(a[2]!=a[3])){inhibit=inhibit & 0x77;
}
if ((ay[2]==ay[3])&&(a[2]!=a[3])){inhibit=inhibit & 0xEE;
}
/*port 0 always uses horiz bit line*/
sel[0]=ax[0];hv_sel[0]='H';
if ((inhibit & 0x80)!=0){
sel[1]=ax[1];sel[2]=ax[2];sel[3]=ax[3];
hv_sel[1]='H';hv_sel[2]='H';hv_sel[3]='H'; }
else {
    if ((inhibit & 0x40)!=0){
sel[1]=ax[1];sel[2]=ax[2];sel[3]=ay[3],
hv_sel [1]='H';hv_sel[2]='H';hv_sel[3]='V'; }
else {
    if ((inhibit & 0x20)!=0){
sel[1]=ax[1];sel[2]=ay[2];sel[3]=ax[3];
hv_sel[1]='H';hv_sel[2]='V';hv_sel[3]='H';}
else {
    if ((inhibit & 0x10)!=0){
sel[1]=ax[1];sel[2]=ay[2];sel[3]=ay[3];
hv_sel[1]='H';hv_sel[2]='V';hv_sel[3]='V'; }
else {
    if ((inhibit & 0x08)!=0){
sel[1]=ay[1];sel[2]=ax[2];sel[3]=ax[3];
hv_sel[1]='V';hv_sel[2]='H';hv_sel[3]='H'; }
else {
    if ((inhibit & 0x04)!=0){
sel[1]=ay[1];sel[2]=ax[2];sel[3]=ay[3];
hv_sel[1]='V';hv_sel[2]='H';hv_sel[3]='V'; }
else {
    if ((inhibit & 0x02)!=0){
sel[1]=ay[1];sel[2]=ay[2];sel[3]=ax[3];
hv_sel[1]='V';hv_sel[2]='V';hv_sel[3]='H'; }
else {if ((inhibit & 0x01)!=0){
sel[1]=ay[1];sel[2]=ay[2];sel[3]=ay[3];
hv_sel[1]='V';hv_sel[2]='V';hv_sel[3]='V'; }
/*error check*/
err=0;
for (ix=0; ix<4; ix++){
    for (ss=ix+1; ss<4; ss++){
        if ((sel[ix]==sel[ss])&&(hv_sel[ix]==hv_sel[ss])&&
        (a[ix]!=a[ss])){
        err=1;}
}}
if (err==1)}
(void) printf("% d % d % d % d % c % d % c % d % c %
    d % c % d\n",
a[0],a[1],a[2],a[3],hv_sel[0],sel[0],hv_sel[1], sel[1],
    hv_sel[2],sel[2],
hv_sel[3], sel[3]);}
num++;
}}}}
(void) printf("number of passes=% d\n", num);
return (0);
}
```

The following Appendix III is an example of a C programming language code simulation of an alternative embodiment for selecting the bit lines in bit priority order. This code corresponds to a hardware implementation which first decodes the four port addresses to a 1-of-16 representation and then OR'S the result to get a 16 bit value containing from 1-to-4 Ones. A solution space is used in which the bit with the value closest to "0000" will use the horizontal bit line. The tree of all possibilities resulting from this choice is constructed and the values which conflict are inhibited. The first viable solution in bit order from "0000" is picked, with the complication that there may be 1, 2, 3 or 4 unique addresses for the 4 port data addresses presented. This program shows that all 65K possibilities yield a correct, unique solution.

Appendix III: C Code Simulation of Bit Order Priority Selection of Bit-Lines

```c
#include <stdio.h>
int a1,a2,a3,a4;
int a1b,a2b,a3b,a4b;
char sel1,sel2,sel3,sel4; /*character identifier of bit line for
    bit n*/
char sel[4];
char bit line[16][2];
char tree[8][4];
int one,ss,j,ix,mask,b_address,useh,usev;
int num,unq;
main( )
{
one=1;
for (a1=0; a1<16;a1++){
    a1b=one<<a1;
        for (a2=0; a2<16;a2++){
            a2b=one<<a2;
            for (a3=0; a3<16;a3++){
                a3b=one<<a3;
                for (a4=0; a4<16;a4++){
            a4b=one<<a4;
/*all addresseses are generated at this point—now to select
    which bit line to use and generate mux select for each
    port*/
/*create the mask of all bits selected*/
b_address=a1b|a2b|a3b|a4b, /*1sb=address 0000*/
/*initialize array of bit line connections*/
bit line[0][0]='B'; bit line[0][1]='A';
bit line[1][0]='B'; bit line[1][1]='C',
bit line[2][0]='B'; bit line[2][1]='E';
bit line[3][0]='B'; bit line[3][1]='G';
bit line[4][0]='D'; bit line[4][1]='A';
bit line[5][0]='D'; bit line[5][1]='C';
bit line[6][0]='D'; bit line[6][1]='E';
bit line[7][0]='D'; bit line[7][1]='G';
bit line[8][0]='F'; bit line[8][1]='A',
bit line[9][0]='F'; bit line[9][1]='C';
bit line[10][0]='F'; bit line[10][1]='E';
bit line[11][0]='F'; bit line[11][1]='G';
bit line[12][0]='H'; bit line[12][1]='A';
bit line[13][0]='H'; bit line[13][1]='C';
bit line[14][0]='H'; bit line[14][1]='E';
bit line[15][0]='H'; bit line[15][1]='G';
/*initialize tree storage array*/
for (ix=0;ix<8;ix++){
    for (ss=0;ss<4;ss++){
        tree[ix][ss]=' ';}}
unq=0;
    for (ix=0; ix<16;ix++){
        mask=one<<ix;
        if ((mask & b_address)!=0) {
        tree[0][unq]=bit line[ix][0];
        tree[2][unq]=bit line[ix][0];
        tree[4][unq]=bit line[ix][0];
        tree[6][unq]=bit line[ix][0];
        tree[1][unq]=bit line[ix][1];
        tree[3][unq]=bit line[ix][1];
```

```
            tree[5][unq]=bit line[ix][1];
            tree[7][unq]=bit line[ix][1];
unq++;
}}
/*inhibit equal bit lines in tree*/
if (tree[0][0]==tree[0][1]){
    tree[0][1]=' ';
    tree[0][2]=' ';tree[1][2]=' ';
    tree[0][3]=' ';tree[1][3]=' ';tree[2][3]=' ';tree[3][3]='"
        ';}
if (tree[0][0]==tree[0][2]){
    tree[0][3]=' ';tree[1][3]=' ';tree[0][2]=' ';}
if (tree[0][0]==tree[0][3]){
    tree[0][3]=' ';}
if (tree[0][1]==tree[0][2]){
    tree[0][3]=' ';tree[1][3]=' ';tree[0][2]=' ';}
if (tree[0][2]==tree[0][3]){
    tree[0][3]=' ';}
if (tree[0][0]==tree[2][3]){
    tree[2][3]=';}
if (tree[0][1]==tree[2][3]){
    tree[2][3]=' ';}
if (tree[1][2]==tree[3][3]){
    tree[3][3]=' ';}
if (tree[0][0]==tree[2][2]){
    tree[4][3]=' ';tree[5][3]=' ';tree[2][2]=' ';}
if
    tree[4][3]=' ';}
if (tree[1][1]==tree[5][3]){
    tree[5][3]=' ';}
if (tree[1][1]==tree[3][2])}
    tree[3][2]=' ';tree[6][3]=' ';tree[7][3]=' ';}
if (tree[0][0]==tree[6][3]){
    tree[6][3]=' ';}
if (tree[1][1]==tree[7][3]){
    tree[7][3]=' ';}
if (tree[3][2]==tree[7][3]){
    tree[7][3]=' ';}
/*pick bit line to use in bit priority order*/
sel1=tree[0][0];sel2=' ';sel3=' ';sel4=' ';
if (tree[0][3]!=' '){
    sel4=tree[0][3];sel3=tree[0][2];sel2=tree[0][1];}
    else {
      if (tree[1][3]!=' '){
        sel4=tree[1][3];sel3=tree[0][2];sel2=tree[0][1];}
      else {
        if (tree[2][3] !=' ')}
          sel4=tree[2][3]; sel3=tree[1][2]; sel2=tree[0][1];}
        else {
          if (tree[3][3]!=' '){
            sel4=tree[3 (tree[2][2]==tree[4][3]){][3];sel3=tree
              [1][2];sel2=tree[0][1];}
          else {
            if (tree[4][3]!=' '){
              sel4=tree[4][3];sel3=tree[2][2];sel2=tree[1][1];}
            else {
              if (tree[5][3]!=' '){
                sel4=tree[5][3];sel3=tree[2][2];sel2=tree[1][1];}
              else {
                if (tree[6][3]!=' '){
                  sel4=tree[6][3];sel3=tree[3][2];sel2=tree[1][1];}
                else {
                  if (tree[7][3]!=' '){
                    sel4=tree[7][3];sel3=tree[3][2];sel2=tree[1][1];}
                  else {
                    if (tree[0][2]!=' '){
                      sel4=tree[0][3];sel3=tree[0][2];sel2=tree[0][1];}
                    else {
                      if (tree[1][2]!=' '){
                        sel4=tree[0][3];sel3=tree[1][2];sel2=tree[0][1];}
                      else {
                        if (tree[2][2]!=' '){
                          sel4=tree[0][3];sel3=tree[2][2];sel2=tree[1][1];}
                        else {
                          if (tree[3][2]!=' '){
                            sel4=tree[0][3];sel3=tree[3][2];sel2=tree[1][1];}
                          else {
                            if (tree[0][1]!=' '){
                              sel4=tree[0][3];sel3=tree[0][2];sel2=tree[0][1];}
                            else {
                              if (tree[1][1]!=' '){
                                sel4=tree[0][3];sel3=tree[0][2];sel2=tree[1][1];}
                              else { }
}}}}}}}}}}}}
sel[0]=sel1;sel[1]=sel2;sel[2]=sel3;sel[3]=sel4;
/*now check for an error in selection*/
if ((((sel[0]==sel[1])&&(sel[1]!=' '))||
    ((sel[0]==sel[2])&&(sel[2]!=' '))||
    ((sel[0]==sel[3])&&(sel[3]!=' '))||
    ((sel[1]==sel[2])&&(sel[1]!=' '))||
    ((sel[1]==sel[3])&&(sel[1]!=' '))||
    ((sel[2]==sel[3])&&(sel[2]!=' ')))||
{
(void) printf("a a a a a a a a \n");
(void) printf("% d % d % d % d % c % c % c %
    c\n",a1,a2,a3,a4,sel1,sel2,sel3,sel4);
(void) printf("% d % d % d % d % c % c % c %
    c\n",a1,a2,a3,a4,sel[1],sel[2],sel[3],sel[4]);
}
num++;
}}}}
(void) printf("number of passes=% d\n", num);
return (0);
}
```

Thus, while we have described our preferred embodiments of our invention, with alternatives, it will be understood that those skilled in the art, both now and in the future, may implement various equivalents, improvements and enhancements which fall within the scope of the claims which follow. These claims should be construed to maintain the proper protection for the invention first disclosed.

We claim:

1. A multi-port static random access memory (SRAM) core cell array, comprising:
   a plurality of core cells arranged in a rectangular N×M×P array of N rows, M columns and P planes, wherein the array includes one core cell per bit; each core cell including:
   a data latch for storing binary data, the data latch having an input for writing data into the latch and an output for reading data from the latch;
   at least two access devices, each having a first input connected to the data latch and a second input controllable by a gating logic signal, which when active transfers latched data to an output of an access device, wherein a number of the access devices is less than or equal to ceiling ($\log_2$ B), where B is a number of ports in the multi-port SRAM;

a plurality of horizontal and vertical bit lines connected to outputs of the access devices, wherein the output of a first access device is connected via a horizontal bit line to the output of all first access devices of all cells in a same row, the output of a second access device is connected via a vertical bit line to the output of all second access devices of all cells in a same column; and a plurality of multiplexers each having a plurality of inputs and a data out port for selectably outputting data in the core cell array, wherein all vertical bit lines are connected to said inputs of at least one multiplexer and wherein all horizontal bit lines are connected to said inputs of at least a second multiplexer.

2. The multi-port SRAM of claim 1, wherein the access devices comprise one of a static AND gate and a differentially connected FET pair.

3. The multi-port SRAM of claim 1, further comprising:

means for selecting a correct access device from among the at least two access devices and for conditioning a correct multiplexer select signal to couple a correct bit as specified by a port read address to a correct data out port.

4. The multi-port SRAM of claim 3, wherein said means for selecting a correct access device comprises:

tree walking logic means for selecting the correct device as a function of port order; and conflict detection means for detecting a conflicts between selected bit lines; and means for modifying a port ordering in response to a detected conflict.

5. The multi-port SRAM of claim 4, wherein said tree walking logic means for selecting a correct access device assigns port 1 to a horizontal bit line.

6. The multi-port SRAM of claim 3, wherein said tree walking logic means comprises:

tree walking logic means for selecting the correct device as a function of bit order; and conflict detection means for detecting a conflicts between selected bit lines; and means for modifying a bit ordering in response to a detected conflict.

7. The multi-port SRAM of claim 1, further comprising:

address register and address pre-decode means for storing presented read addresses of each port and pre-decoding associated address bits for generation of bit line and multiplexer controls;

tree walk inhibit generation means for walking a tree of possible bit line and multiplexer choices to find bit line conflicts and for generating inhibit signals to prevent conflicting choices by setting all nodes in a branch containing a conflict to null, coupled to said address register and address pre-decode means;

multiplexer select generation means for generating the correct multiplexer select signals to the multiplexers by selecting a first non-null leaf node in the tree and gating ports using nodes of the tree from a selected leaf to a root of the tree, coupled to said tree walk inhibit generation means;

word line gate generation means for generating gating signals for each of the access devices using an output of said pre-decode means and a multiplexer selection generated by said multiplexer select generation means.

8. The multi-port SRAM of claim 1, wherein each cell is identified by a unique index comprising a binary address associated with each data latch.

9. The multi-port SRAM of claim 1, further comprising an N×M×I array of said core cells wherein said index {i,j} identifies a row (i) and column (j) of each bit.

10. The multi-port SRAM of claim 8, further comprising:

decoder means for deriving select signals for the multiplexers by decoding the row and and column index components of a cell address.

11. The multi-port SRAM of claim 4, wherein said means for selecting a correct access device from among the at least two access devices and for conditioning a correct multiplexer select signal to couple a correct bit as specified by a port read address to a correct data out port, further comprises:

address register and address pre-decode means for storing presented read addresses of each port and pre-decoding associated address bits for generation of bit line and multiplexer controls; and an inhibit generation circuit comprising:

a plurality of two-bit comparators each having two inputs and an output, wherein the output is true if the inputs are equal;

a plurality of four bit comparators each having two inputs and an output, wherein the output is false if both inputs are equal;

wherein each of the two bit compares detects for conflicts between horizontal components of said read addresses of each port and between vertical components of said read addresses of each port;

a plurality of AND gates each having a plurality of inputs coupled to the outputs at least two of the comparators, for inhibiting the detection of a conflict if all bits of two port addresses are identical; and a second plurality of AND gates for constructing a path from a root to a leaf of a tree representation of all possible horizontal and vertical bit line selections for said addresses.

12. The multi-port SRAM of claim 11, further comprising:

multiplexer select generation means for generating the correct multiplexer select signals to the multiplexers by selecting a first non-null leaf node in the tree representation and gating ports using nodes of the tree representation from a selected leaf to a root of the tree representation, coupled to said inhibit generation circuit.

* * * * *